United States Patent
Aubel et al.

(10) Patent No.: US 9,362,239 B2
(45) Date of Patent: Jun. 7, 2016

(54) VERTICAL BREAKDOWN PROTECTION LAYER

(71) Applicant: GLOBALFOUNDRIES Inc., Grand Cayman (KY)

(72) Inventors: Oliver Aubel, Dresden (DE); Georg Talut, Dresden (DE); Thomas Werner, Reichenberg-Moritzburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/519,291

(22) Filed: Oct. 21, 2014

(65) Prior Publication Data

US 2016/0111382 A1    Apr. 21, 2016

(51) Int. Cl.
*H01L 23/52* (2006.01)
*H01L 23/60* (2006.01)
*H01L 23/532* (2006.01)
*H01L 23/522* (2006.01)

(52) U.S. Cl.
CPC .......... *H01L 23/60* (2013.01); *H01L 23/53214* (2013.01); *H01L 23/53219* (2013.01); *H01L 23/53228* (2013.01); *H01L 23/53233* (2013.01); *H01L 23/53261* (2013.01); *H01L 23/5226* (2013.01); *H01L 2221/1036* (2013.01); *H01L 2224/05006* (2013.01); *H01L 2224/05546* (2013.01)

(58) Field of Classification Search
CPC ................... H01L 23/5226; H01L 2221/1036; H01L 2224/05006; H01L 2224/05546
See application file for complete search history.

(56) References Cited

U.S. PATENT DOCUMENTS

| | | | |
|---|---|---|---|
| 6,278,148 B1* | 8/2001 | Watanabe et al. | 257/296 |
| 6,594,119 B1* | 7/2003 | Koshikawa et al. | 360/294.3 |
| 7,176,121 B2* | 2/2007 | Ohmori | H01L 21/76807 257/E21.576 |
| 8,749,058 B2* | 6/2014 | Usami | H01L 23/5226 257/639 |
| 2008/0012142 A1* | 1/2008 | Mehta | H01L 21/76802 257/762 |
| 2008/0111239 A1* | 5/2008 | Yang | H01L 21/76847 257/751 |
| 2009/0179203 A1* | 7/2009 | Ning | G02F 1/136286 257/72 |
| 2010/0055903 A1* | 3/2010 | Werner | H01L 21/02164 438/675 |
| 2010/0136764 A1* | 6/2010 | Dirnecker et al. | 438/384 |
| 2010/0252930 A1* | 10/2010 | Liao et al. | 257/762 |
| 2010/0267232 A1* | 10/2010 | Shih et al. | 438/655 |
| 2011/0003474 A1* | 1/2011 | Liu et al. | 438/653 |
| 2011/0021036 A1* | 1/2011 | Braecklmann et al. | 438/763 |
| 2011/0074033 A1* | 3/2011 | Kaltalioglu et al. | 257/758 |
| 2012/0025382 A1* | 2/2012 | Riess et al. | 257/751 |
| 2012/0025392 A1* | 2/2012 | Streck et al. | 257/773 |
| 2012/0104622 A1* | 5/2012 | Kim et al. | 257/774 |
| 2012/0112259 A1* | 5/2012 | Cremer et al. | 257/296 |
| 2016/0056104 A1* | 2/2016 | Bouche | H01L 23/528 257/741 |

* cited by examiner

*Primary Examiner* — Ida M Soward
(74) *Attorney, Agent, or Firm* — Amerson Law Firm, PLLC

(57) ABSTRACT

The present disclosure relates to a semiconductor structure including a plurality of connecting lines arranged on a plurality of vertical levels, the plurality of connecting lines including at least a first connecting line arranged in a first vertical level and a second connecting line arranged in a second vertical level, different from the first vertical level, and a breakdown prevention layer placed in at least part of the vertical space separating the first connecting line from the second connecting line.

20 Claims, 2 Drawing Sheets

VERTICAL BREAKDOWN PROTECTION LAYER

BACKGROUND OF THE INVENTION

1. Field of the Invention

Generally, the present disclosure relates to highly sophisticated semiconductor structures, and, in particular, to a protection layer for avoiding vertical voltage breakdown in highly advanced semiconductor technologies.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. This includes several connection lines between different components, such as transistors and diodes. The connection lines are organized on multiple vertical levels, also known as metal levels. On each metal level, a plurality of connection lines may be realized.

The proximity, both horizontal and vertical, of connection lines results in several issues. The signal in a given line may be influenced by neighboring lines due to the parasitic capacitance present between the lines. Even more dangerously, there is a risk of a voltage breakdown between neighboring lines.

The possibility of a voltage breakdown depends on the materials used, the voltages present and the dimensions and placement of the lines. In view of further device scaling, it is expected that the distance between neighboring metal lines will get smaller and smaller at each technology node, both in the vertical and horizontal direction. This increases the risk of a breakdown through the insulator between the metal lines.

Although this is at least partially compensated for by the reduction in operating voltages, there are applications in which voltages cannot be reduced enough to compensate for the reduced distance, for instance, automotive or high voltage applications such as those needed for the operation of fuses or similar devices.

Moreover, while the horizontal distance between metal lines can be varied for each metal line with respect to its neighboring lines, the same cannot be done in the vertical direction. So, for instance, if, on a metal level, only one metal line has a high voltage applied to it, horizontally neighboring metal lines can be spaced further apart to avoid any issues. However, the same cannot be done in the vertical direction since the increase in the vertical spacing would negatively reflect on all of the metal lines of the metal plane, which do not need the increased vertical spacing, and not only on the one carrying the high voltage.

In view of the situation described above, the present disclosure relates to semiconductor structures and manufacturing techniques thereof allowing the realization of at least one high voltage metal line on a metallization level of an integrated chip which avoids the risk of voltage breakdown.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure solves the above-mentioned problems by using a dielectric prevention layer, at least in the vertical direction, increasing the dielectric separation in the vertical direction between neighboring metal lines.

One illustrative embodiment disclosed herein may relate to a semiconductor structure including a plurality of connecting lines arranged on a plurality of vertical levels, the plurality of connecting lines including at least a first connecting line arranged in a first vertical level and a second connecting line arranged in a second vertical level, different from the first vertical level, and a breakdown prevention layer placed in at least part of the vertical space separating the first connecting line from the second connecting line. In some embodiments, the breakdown prevention layer may comprise any of SiN, SiCN, TEOS or any other dielectric film. In some embodiments, the breakdown prevention layer may have a thickness up to a few tens of nm. In some embodiments, the part of the vertical space separating the first connecting line from the second connecting line not occupied by the breakdown prevention layer comprises a silicon-based insulator, preferably SiCOH or SiO2. In some embodiments, the first connecting line and/or the second connecting line may be made of copper and/or copper alloys, preferably CuMn and/or CuAl, and/or aluminum.

BRIEF DESCRIPTION OF THE DRAWINGS

The disclosure may be understood by reference to the following description taken in conjunction with the accompanying drawings, in which like reference numerals identify like elements, and in which.

Figure 1A:
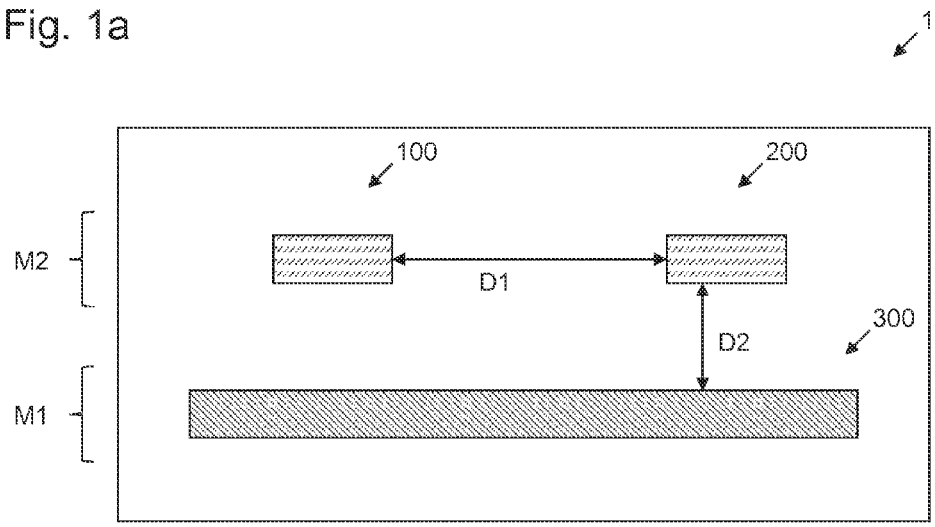
FIG. 1a schematically illustrates a cross-sectional view along section A-A' of FIG. 1b of a semiconductor structure according to the state of the art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it will be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Figure 1B:
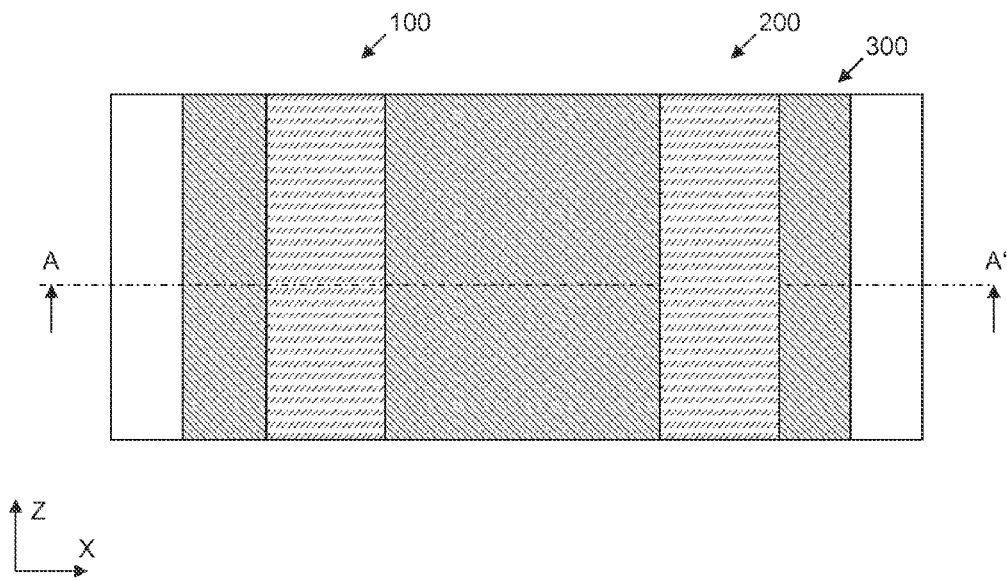
FIG. 1b schematically illustrates a top view of FIG. 1a, according to the state of the art.

FIG. 1a schematically illustrates a cross-sectional view of a semiconductor structure 1 in accordance with the state of the art. FIG. 1b schematically illustrates a top view of the same semiconductor structure. The cross-sectional view of FIG. 1a is taken along line A-A' of FIG. 1b.

In FIG. 1a, two metal levels M1 and M2 are illustrated. This is for convenience only, and several metal levels could be present instead. Also, for convenience, only one metal line 300 is shown on metal level M1 and only two metal lines 100 and 200 are shown on metal level M2. Also in this case, several metal lines could be realized instead.

As can be seen, the vertical distance between two metal lines 100 and 300 is D2, which may have a value in the range of tens to hundreds of nanometers. The horizontal distance between two metal lines 100 and 200 is D1, which may have a value larger than 40 nm. As previously mentioned, the horizontal distance D1 may be changed for each couple of metal lines on the same metal level. In this way, if one metal line has a higher voltage to carry, the neighboring metal lines may be spaced further away. To the contrary, the distance D2 must be the same for all metal lines in level M1 and M2. Increasing distance D2 only to avoid voltage breakdown on a single metal line 100, where several other thousand metal lines 200 on the same level do not need such an increased distance, would not be effective as it would increase the thickness of the chip, thus increasing costs, slowing down signal propagation and worsening heat dissipation.

Figure 2A:
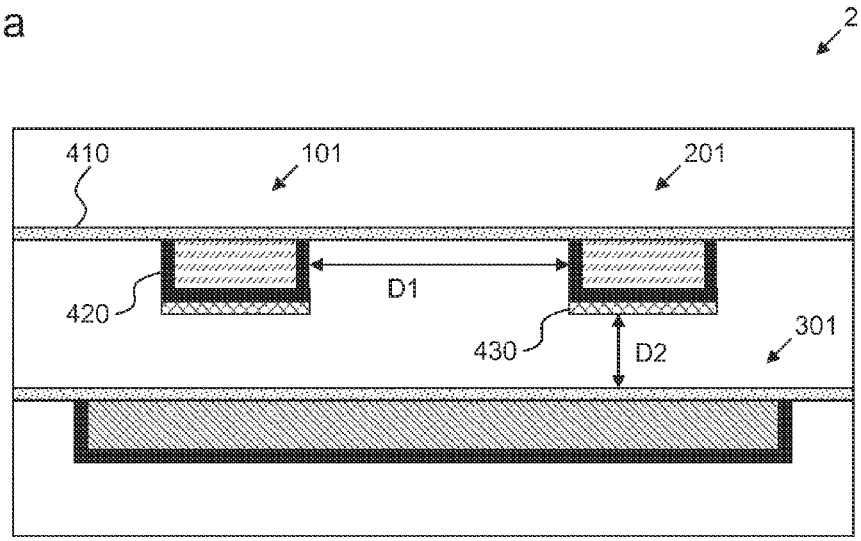
FIG. 2a schematically illustrates a cross-sectional view along section A-A' of FIG. 2b of a semiconductor structure according to an embodiment of the invention.
Figure 2A:
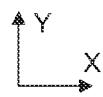
Figure 2B:
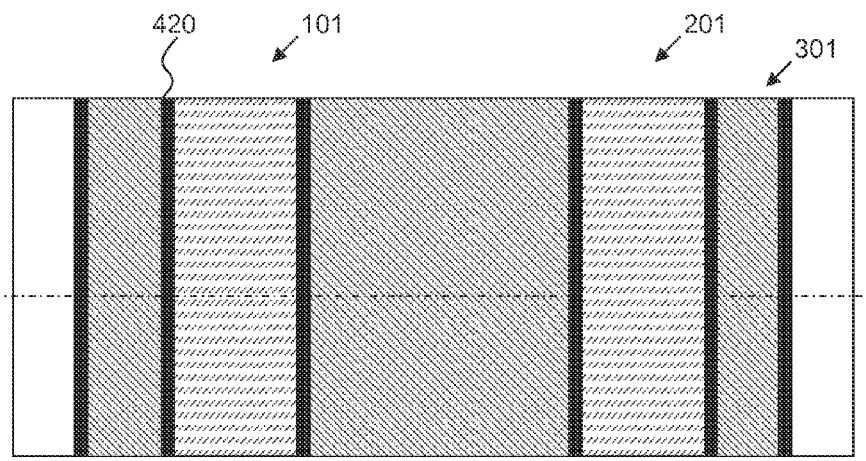
FIG. 2b schematically illustrates a top view of FIG. 2a, according to an embodiment of the invention.
Figure 2B:
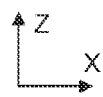

FIG. 2a schematically illustrates a cross-sectional view of a semiconductor structure 2 in accordance with an embodiment of the present invention. FIG. 2b schematically illustrates a top view of the same semiconductor structure. The cross-sectional view of FIG. 2a is taken along line A-A' of FIG. 2b. It should be noted that, for ease of visual representation, in FIG. 2b, the layer 410 above metal lines 101, 201 and 301 is not illustrated.

In semiconductor structure 2, the dielectric insulation in the vertical direction between metal lines 101-301 and between metal lines 201-301 is increased by means of a dielectric breakdown prevention layer 430. The dielectric breakdown protection layer 430 could be any of SiN, SiCN, TEOS, or other silicon-based dielectrics. It could be put in place prior to the realization of metal lines 101 and 201 by means of physical vapor deposition (PVD), chemical vapor deposition (CVD) or spin-on processes. The metal lines could be made of Cu and/or Cu alloys, such as CuMn or CuAl, or Al, or, in general, any metallic material. The dielectric between the metal lines could be silicon-based, such as SiCOH or SiO2. Each of layers 410, 420, 430 could have a thickness in the range of 5-30 nm, which may become smaller in future technologies.

Thanks to the presence of dielectric breakdown prevention layer 430, the dielectric insulation between the metal lines is increased, at least in the vertical direction. In fact, the dielectric breakdown prevention layer 430 may have a dielectric constant larger than four, which is higher than the dielectric constant of the dielectric usually present in the space between the metal lines 101, 201 and 301, such as, for instance, silicon oxide, or SiCOH with a dielectric constant, for instance, smaller than three. Moreover, in some embodiments, the layer 430 could be used as an etch damage protection layer of the dielectric during trench etch.

The addition of the dielectric breakdown prevention layer 430 does not negatively impact the signal propagation. In particular, due to the presence of the breakdown prevention layer 430, the thickness in the Y direction of metal line 101 and 201 is reduced and this increases the resistance of the lines. However, the increased resistance could be brought back to its original value (i.e., without the breakdown prevention layer 430) by increasing the thickness of the metal line 101, 201. Alternatively, the increased resistance could be tolerated since, usually, high voltage metal lines do not carry signals with a critical impact on the timing of the ASIC.

Moreover, although both lines 101 and 201 are illustrated as being provided with the breakdown prevention layer 430, the invention is not limited thereto. The application of the breakdown prevention layer 430 could be limited to those lines carrying a voltage higher than a certain threshold, for instance 1.8V in a 28 nm node. That is, assuming, for instance, that metal line 101 has a low voltage and metal line 201 has a high voltage signal, only metal line 201 could be provided with the breakdown prevention layer 430.

Furthermore, it will be clear to those skilled in the art that, although described and illustrated, layers 410 and 420 are not necessary to carry out the present invention and they have been included for providing additional details on one specific implementing embodiment of the present invention. In particular, layer 410 may be a SiCN based dielectric cap with any of the following functions: (a) adhesion layer between Cu and SiCOH (dielectric), and/or (b) etch stop layer for via etch, and/or (c) prevent Cu diffusion into the dielectric, while layer 420 may be a Ta-based barrier (bi-) layer to prevent Cu diffusion into the dielectric. Alternatively, or in addition, the breakdown prevention layer 430 could be in direct contact with the metal line 101 and/or 201 and/or 301.

Moreover, although the breakdown prevention layer 430 has been illustrated as being placed underneath metal lines 101 and 201, the present invention is not limited thereto. Alternatively, or in addition, it will be clear to those skilled in the art that the same result could be achieved by placing it above metal line 301, and/or anywhere in the space vertically separating lines 101 and 301 or lines 201 and 301.

Additionally, although connecting lines 100-300 and 101-301 have been described as metal lines, the present invention is not limited to the use of fully metallic connecting lines. Alternatively, or in addition, lines containing doped semiconducting material, or a mixture of the latter and metal, such as, for instance, silicide lines, could be used.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A semiconductor structure, comprising:
   a plurality of connecting lines arranged on a plurality of vertical levels, said plurality of connecting lines comprising at least a first connecting line arranged in a first vertical level and a second connecting line arranged in a second vertical level that is different from said first vertical level; and
   a dielectric breakdown prevention layer positioned in a vertical space separating said first connecting line from said second connecting line, said dielectric breakdown prevention layer and said first connecting line having substantially a same lateral width.

2. The semiconductor structure of claim 1, wherein said dielectric breakdown prevention layer is a silicon-based dielectric film.

3. The semiconductor structure of claim 1, wherein said dielectric breakdown prevention layer has a thickness in the range of approximately 5-30 nm.

4. The semiconductor structure of claim 1, wherein said first connecting line and said dielectric breakdown prevention layer are embedded in a layer of a silicon-based insulator material, a portion of said layer of said silicon-based insulator material being in said vertical space and separating said dielectric breakdown prevention layer from said second connecting line.

5. The semiconductor structure of claim 1, wherein at least one of said first connecting line and said second connecting line comprises one of copper and aluminum.

6. The semiconductor structure of claim 5, wherein said at least one of said first and second connecting lines comprises one of a CuMn alloy and a CuAl alloy.

7. The semiconductor structure of claim 4, wherein said silicon-based insulator material comprises one of SiCOH and $SiO_2$.

8. The semiconductor structure of claim 4, wherein said first connecting line comprises a layer of conductive metal and a diffusion barrier layer positioned between said layer of conductive metal and said layer of said silicon-based insulator material.

9. The semiconductor structure of claim 4, wherein said layer of conductive metal comprises copper and said diffusion barrier layer comprises tantalum.

10. The semiconductor structure of claim 2, wherein said silicon-based dielectric film comprises one of SiN and SiCN.

11. The semiconductor structure of claim 1, further comprising an etch stop layer positioned in said vertical space and between said dielectric breakdown prevention layer and said second connecting line.

12. A semiconductor structure, comprising:
    a first metal level, comprising:
       a first dielectric layer; and
       a first conductive connecting line embedded in said first dielectric layer; and
    a second metal level positioned vertically adjacent to said first metal level, said second metal level comprising:
       a second dielectric layer;
       a second conductive connecting line embedded in said second dielectric layer; and
       a dielectric breakdown prevention layer embedded in said second dielectric layer, wherein said dielectric breakdown prevention layer is positioned vertically adjacent to said second conductive connecting line, wherein a portion of said second dielectric layer is positioned between and vertically separates said dielectric breakdown prevention layer from said first conductive connecting line, and wherein said second conductive connecting line has substantially a same lateral width as said dielectric breakdown prevention layer.

13. The semiconductor structure of claim 12, further comprising a dielectric etch stop layer positioned between said dielectric breakdown prevention layer and said first conductive connecting line.

14. The semiconductor structure of claim 12, wherein a dielectric constant of said dielectric breakdown prevention layer is greater than a dielectric constant of said second dielectric layer.

15. The semiconductor structure of claim 14, wherein said second conductive connecting line comprises a layer of conductive metal and a diffusion barrier layer positioned between said layer of conductive metal and said second dielectric material.

16. The semiconductor structure of claim 12, wherein said first metal level is positioned vertically below said second metal level.

17. The semiconductor structure of claim 16, wherein a bottom surface of said second conductive connecting line directly contacts said dielectric breakdown prevention layer.

18. The semiconductor structure of claim 17, further comprising a third conductive connecting line embedded in said second dielectric layer and positioned laterally adjacent to said second conductive connecting line, wherein a further portion of said second dielectric layer vertically separates said third conductive connecting line from said first conductive connecting line and directly contacts a bottom surface of said third conductive connecting line, said second conductive connecting line being adapted to carry a higher voltage than said third conductive connecting line.

19. The semiconductor structure of claim 12, wherein said first metal level is positioned vertically above said second metal level.

20. The semiconductor structure of claim 12, wherein said first and second dielectric layers comprise a same silicon-based dielectric insulator material.

* * * * *